(12) United States Patent
Yang et al.

(10) Patent No.: US 9,645,464 B2
(45) Date of Patent: May 9, 2017

(54) LIQUID CRYSTAL DISPLAYS WITH MINIMIZED TRANSMISSION LOSS AND ENHANCED OFF-AXIS COLOR FIDELITY

(71) Applicant: Apple Inc., Cupertino, CA (US)

(72) Inventors: Byung Duk Yang, Cupertino, CA (US); Chia Hsuan Tai, Sunnyvale, CA (US); Hiroshi Osawa, Sunnyvale, CA (US); Kyung Wook Kim, Cupertino, CA (US); Ming-Chin Hung, Cupertino, CA (US); Shang-Chih Lin, Los Altos, CA (US); Shih Chang Chang, Cupertino, CA (US); Yu Cheng Chen, San Jose, CA (US); Yuan Chen, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 62 days.

(21) Appl. No.: 14/850,006

(22) Filed: Sep. 10, 2015

(65) Prior Publication Data
US 2016/0209691 A1 Jul. 21, 2016

Related U.S. Application Data

(60) Provisional application No. 62/104,995, filed on Jan. 19, 2015.

(51) Int. Cl.
*G02F 1/1333* (2006.01)
*G02F 1/1368* (2006.01)
(Continued)

(52) U.S. Cl.
CPC ............. *G02F 1/1368* (2013.01); *G02B 6/00* (2013.01); *G02F 1/1362* (2013.01); *G02F 1/13338* (2013.01); *G02F 1/133345* (2013.01); *G02F 1/133514* (2013.01); *G02F 1/133528* (2013.01); *G02F 1/136209* (2013.01); *H01L 29/518* (2013.01); *H01L 29/78606* (2013.01); *G02F 2001/133521* (2013.01); *G02F 2001/136222* (2013.01)

(58) Field of Classification Search
CPC ................................................ G02F 1/133345
See application file for complete search history.

(56) References Cited

U.S. PATENT DOCUMENTS 7,106,406 B2 9/2006 Lee et al.
7,385,659 B2 6/2008 Kotchick et al.
(Continued)

*Primary Examiner* — Kendrick Hsu
(74) *Attorney, Agent, or Firm* — Treyz Law Group, P.C.; G. Victor Treyz; Zachary D. Hadd

(57) ABSTRACT

A display may have upper and lower display layers. A layer of liquid crystal material may be interposed between the upper and lower display layers. The display layers may have substrates. The display layers may include a color filter layer having an array of color filter elements on a glass substrate and a thin-film transistor layer having a layer of thin-film transistor circuitry on a glass substrate. Dielectric layers within the display layers such as dielectric layers within the thin-film transistor layer may have differing indices of refraction. Reflections and color shifts due to index of refraction discontinuities may be minimized by interposing graded index dielectric layers between adjacent layers with different indices. The graded index layers may be formed from structures with a continuously varying index of refraction or structures with a step-wise varying index of refraction.

22 Claims, 10 Drawing Sheets

(51) Int. Cl.
  *G02F 1/1335* (2006.01)
  *G02F 1/1362* (2006.01)
  *H01L 29/786* (2006.01)
  *H01L 29/51* (2006.01)
  *G02B 6/00* (2006.01)

(56) References Cited

U.S. PATENT DOCUMENTS

| | | |
|---|---|---|
| 7,495,725 B2 | 2/2009 | Kim et al. |
| 9,097,933 B2 | 8/2015 | Ki et al. |
| 2013/0300978 A1 | 11/2013 | Yang et al. |

LIQUID CRYSTAL DISPLAYS WITH MINIMIZED TRANSMISSION LOSS AND ENHANCED OFF-AXIS COLOR FIDELITY

This application claims the benefit of provisional patent application No. 62/104,995 filed on Jan. 19, 2015, which is hereby incorporated by reference herein in its entirety.

BACKGROUND

This relates generally to electronic devices, and more particularly, to electronic devices with displays.

Electronic devices often include displays. For example, cellular telephones and portable computers often include displays for presenting information to a user.

Liquid crystal displays contain a layer of liquid crystal material. Pixels in a liquid crystal display contain thin-film transistors and electrodes for applying electric fields to the liquid crystal material. The strength of the electric field in a pixel controls the polarization state of the liquid crystal material and thereby adjusts the brightness of the pixel.

Layers of dielectric such as layers of silicon oxide and silicon nitride may be used in forming the thin-film transistors and other pixel structures in a liquid crystal display. These dielectric layers may have different indices of refraction. For example, a silicon nitride layer may have an index of refraction of about 1.9 and a silicon oxide layer or other dielectric layer may have an index of refraction of 1.51. If care is not taken, index of refraction discontinuities at the interfaces between the dielectric layers in a display may give rise to unwanted reflections and transmission loss. The dielectric layers may also unintentionally serve as a dielectric interference filter, which can lead to undesired off-axis shifts in display color (i.e., color shifts that vary as a function of off-axis viewing angle).

It would therefore be desirable to be able to provide improved displays for electronic devices such as displays with enhanced transmission and reduced off-axis color shifts.

SUMMARY

A display may have upper and lower display layers. A layer of liquid crystal material may be interposed between the upper and lower display layers. The display layers may include a color filter layer having an array of color filter elements on a glass substrate and a thin-film transistor layer having a layer of thin-film transistor circuitry on a glass substrate. Backlight structures may supply backlight that passes through the lower display layer, the liquid crystal layer, and the upper display layer.

Dielectric layers within the display such as dielectric layers within the thin-film transistor layer may have differing indices of refraction. The dielectric layers may include layers of silicon oxide, layers of silicon nitride, conducting oxide layers such as layers of indium tin oxide, polymer layers, gate insulator layers, buffer layers, interlayer dielectric layers, glass layers, spin-on glass layers, and other layers of dielectric material.

Reflections and color shifts due to index of refraction discontinuities may be minimized by interposing graded index dielectric layers between adjacent layers with different indices. The graded index layers may be formed from continuously varying index of refraction structures or stepwise varying index of refraction structures. For example, a graded index layer may be formed from silicon oxynitride material with a continuously varying index of refraction or with multiple sublayers each with a different respective index value.

DETAILED DESCRIPTION

Electronic devices may include displays. The displays may be used to display images to a user. Illustrative electronic devices that may be provided with displays are shown in FIGS. 1, 2, 3, and 4.

Figure 1:
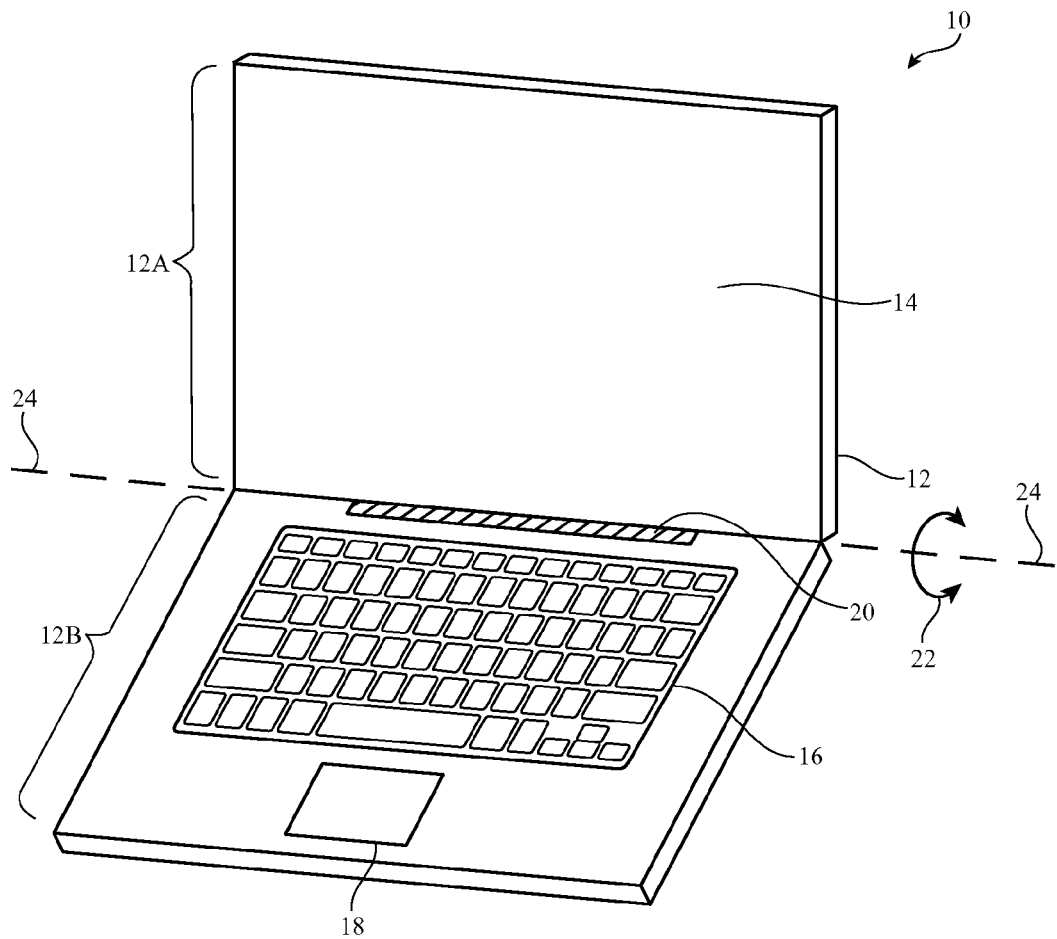
FIG. 1 is a perspective view of an illustrative electronic device such as a laptop computer with a display in accordance with an embodiment.

FIG. 1 shows how electronic device 10 may have the shape of a laptop computer having upper housing 12A and lower housing 12B with components such as keyboard 16 and touchpad 18. Device 10 may have hinge structures 20 that allow upper housing 12A to rotate in directions 22 about rotational axis 24 relative to lower housing 12B. Display 14 may be mounted in upper housing 12A. Upper housing 12A, which may sometimes referred to as a display housing or lid, may be placed in a closed position by rotating upper housing 12A towards lower housing 12B about rotational axis 24.

Figure 2:
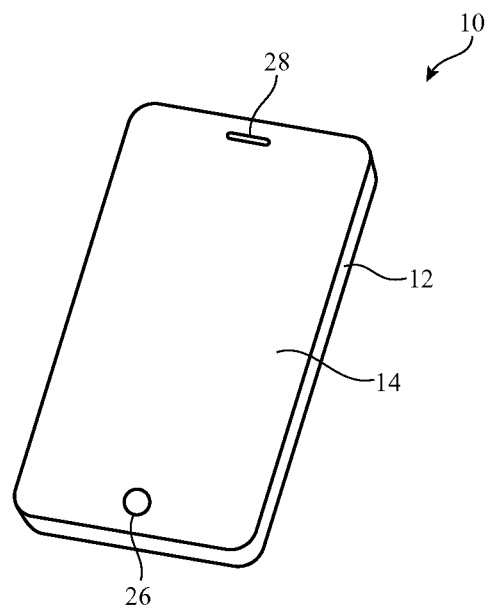
FIG. 2 is a perspective view of an illustrative electronic device such as a handheld electronic device with a display in accordance with an embodiment.

FIG. 2 shows how electronic device 10 may be a handheld device such as a cellular telephone, music player, gaming device, navigation unit, or other compact device. In this type of configuration for device 10, housing 12 may have opposing front and rear surfaces. Display 14 may be mounted on a front face of housing 12. Display 14 may, if desired, have openings for components such as button 26. Openings may also be formed in display 14 to accommodate a speaker port (see, e.g., speaker port 28 of FIG. 2).

Figure 3:
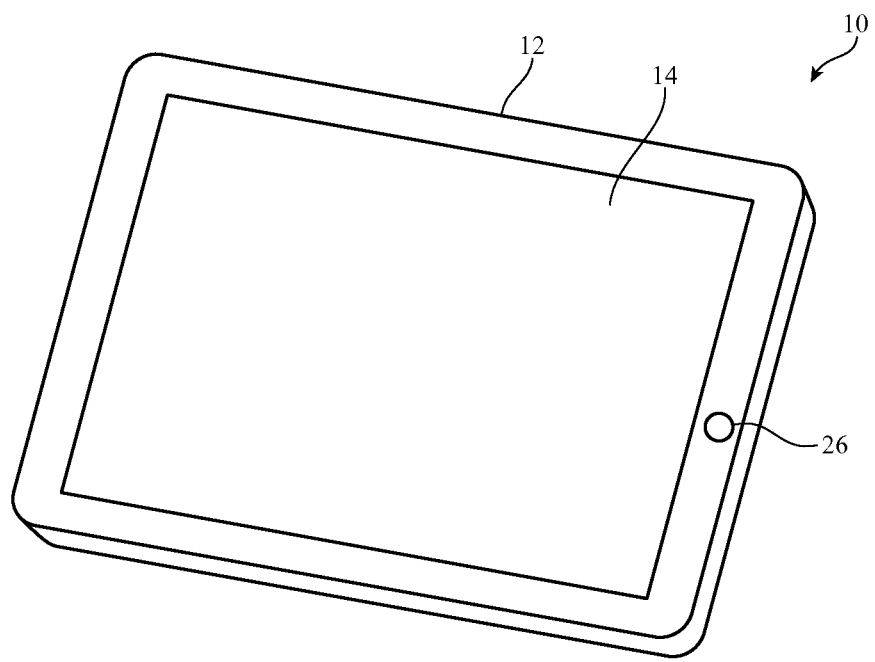
FIG. 3 is a perspective view of an illustrative electronic device such as a tablet computer with a display in accordance with an embodiment.

FIG. 3 shows how electronic device 10 may be a tablet computer. In electronic device 10 of FIG. 3, housing 12 may have opposing planar front and rear surfaces. Display 14 may be mounted on the front surface of housing 12. As shown in FIG. 3, display 14 may have an opening to accommodate button 26 (as an example).

Figure 4:
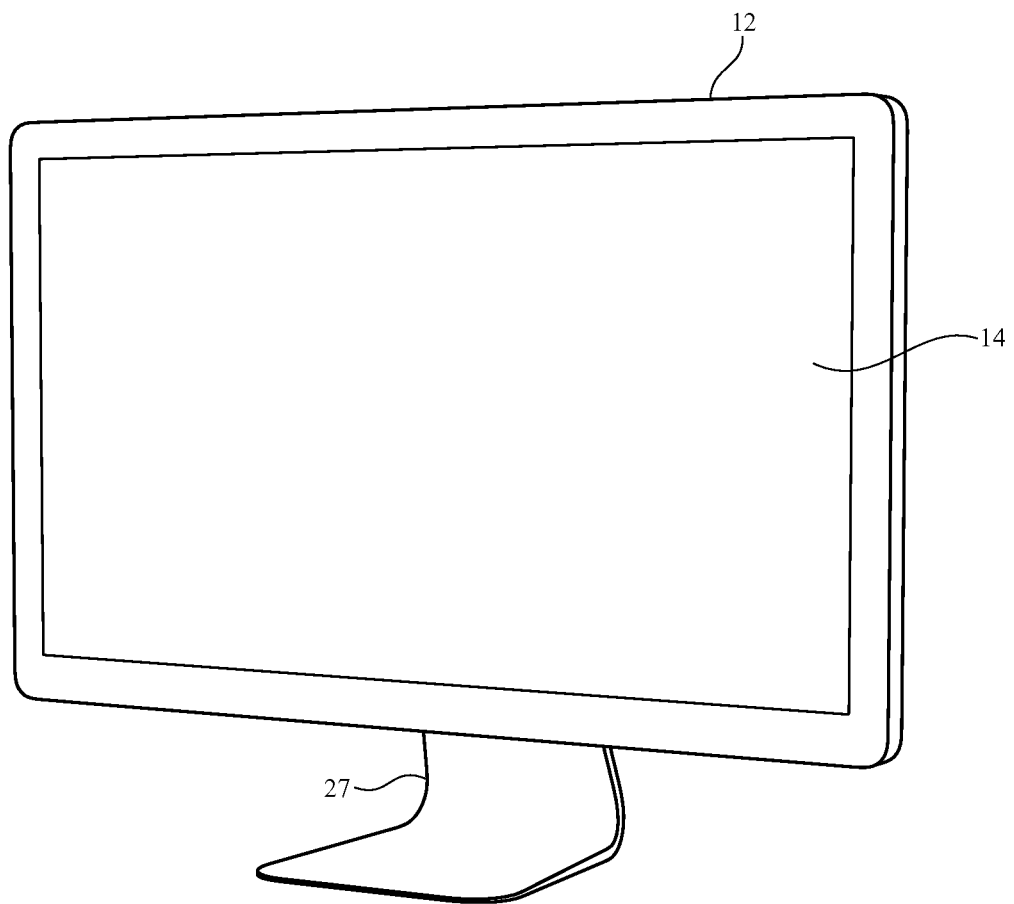
FIG. 4 is a perspective view of an illustrative electronic device such as a computer display with display structures in accordance with an embodiment.

FIG. 4 shows how electronic device 10 may be a computer display or a computer that has been integrated into a computer display. With this type of arrangement, housing 12 for device 10 may be mounted on a support structure such as stand 27 or stand 27 may be omitted (e.g., to mount device 10 on a wall). Display 14 may be mounted on a front face of housing 12.

The illustrative configurations for device 10 that are shown in FIGS. 1, 2, 3, and 4 are merely illustrative. In general, electronic device 10 may be a laptop computer, a computer monitor containing an embedded computer, a tablet computer, a cellular telephone, a media player, or other handheld or portable electronic device, a smaller device such as a wrist-watch device, a pendant device, a headphone or earpiece device, or other wearable or miniature device, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

Housing 12 of device 10, which is sometimes referred to as a case, may be formed of materials such as plastic, glass, ceramics, carbon-fiber composites and other fiber-based composites, metal (e.g., machined aluminum, stainless steel, or other metals), other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Display 14 may be a touch sensitive display that includes a touch sensor or may be insensitive to touch. Touch sensors for display 14 may be formed from an array of capacitive touch sensor electrodes, a resistive touch array, touch sensor structures based on acoustic touch, optical touch, or force-based touch technologies, or other suitable touch sensor components.

Display 14 for device 10 may include pixels formed from liquid crystal display (LCD) components. A display cover layer may cover the surface of display 14 or a display layer such as a color filter layer or other portion of a display may be used as the outermost (or nearly outermost) layer in display 14. The outermost display layer may be formed from a transparent glass sheet, a clear plastic layer, or other transparent member.

Figure 5:
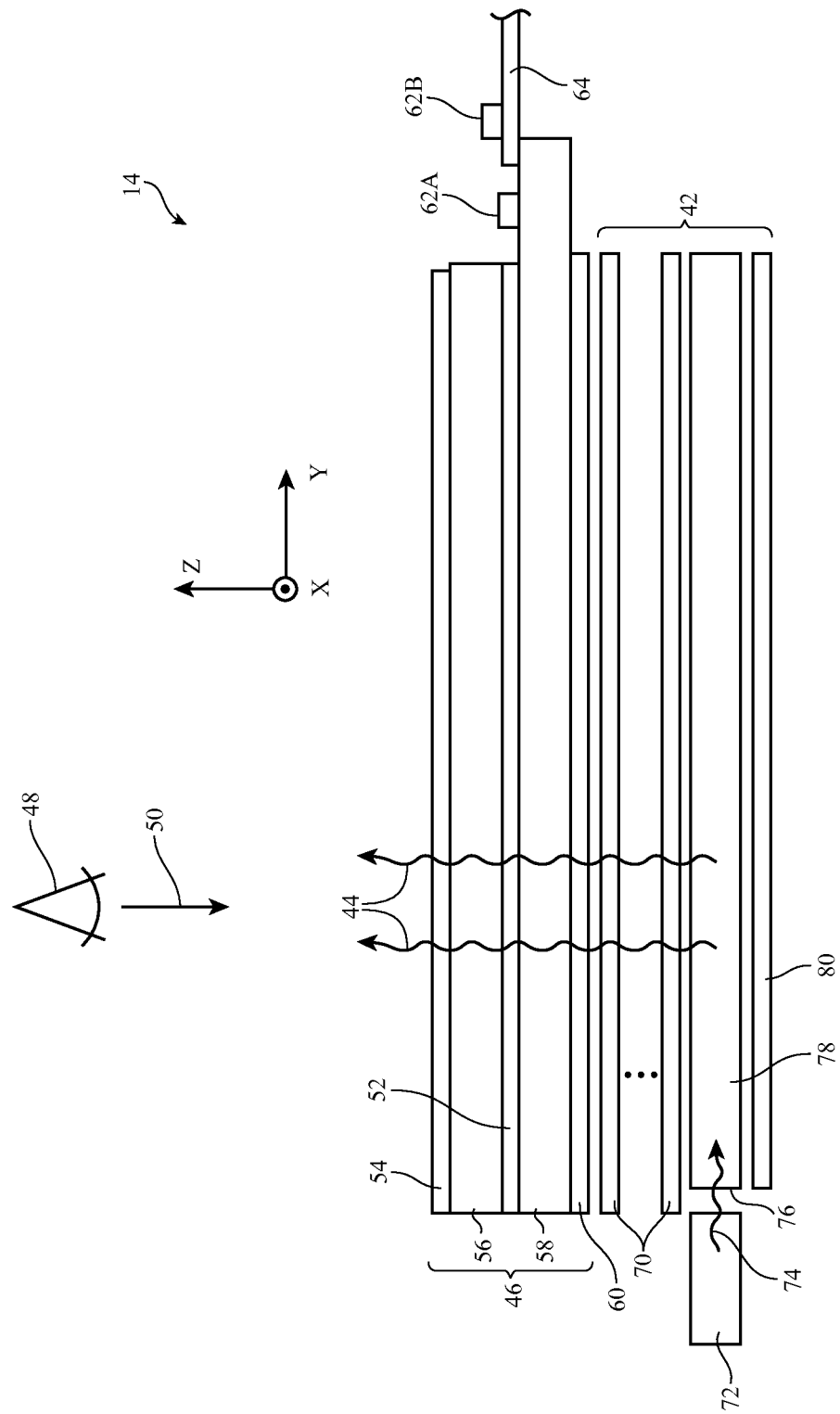
FIG. 5 is a cross-sectional side view of an illustrative display in accordance with an embodiment.

A cross-sectional side view of an illustrative configuration for display 14 of device 10 (e.g., for display 14 of the devices of FIG. 1, FIG. 2, FIG. 3, FIG. 4 or other suitable electronic devices) is shown in FIG. 5. As shown in FIG. 5, display 14 may include backlight structures such as backlight unit 42 for producing backlight 44. During operation, backlight 44 travels outwards (vertically upwards in dimension Z in the orientation of FIG. 5) and passes through display pixel structures in display layers 46. This illuminates any images that are being produced by the display pixels for viewing by a user. For example, backlight 44 may illuminate images on display layers 46 that are being viewed by viewer 48 in direction 50.

Display layers 46 may be mounted in chassis structures such as a plastic chassis structure and/or a metal chassis structure to form a display module for mounting in housing 12 or display layers 46 may be mounted directly in housing 12 (e.g., by stacking display layers 46 into a recessed portion in housing 12). Display layers 46 may form a liquid crystal display or may be used in forming displays of other types.

Display layers 46 may include a liquid crystal layer such a liquid crystal layer 52. Liquid crystal layer 52 may be sandwiched between display layers such as display layers 58 and 56. Layers 56 and 58 may be interposed between lower polarizer layer 60 and upper polarizer layer 54.

Layers 58 and 56 may be formed from transparent substrate layers such as clear layers of glass or plastic. Layers 58 and 56 may be layers such as a thin-film transistor layer and/or a color filter layer. Conductive traces, color filter elements, transistors, and other circuits and structures may be formed on the substrates of layers 58 and 56 (e.g., to form a thin-film transistor layer and/or a color filter layer). Touch sensor electrodes may also be incorporated into layers such as layers 58 and 56 and/or touch sensor electrodes may be formed on other substrates.

With one illustrative configuration, layer 58 may be a thin-film transistor layer that includes an array of pixel circuits based on thin-film transistors and associated electrodes (pixel electrodes) for applying electric fields to liquid crystal layer 52 and thereby displaying images on display 14. Layer 56 may be a color filter layer that includes an array of color filter elements for providing display 14 with the ability to display color images. With another illustrative configuration, the order of layers in display 14 is flipped so that lower layer 58 is a color filter layer and upper layer 56 is a thin-film transistor layer. Configurations in which color filter elements are combined with thin-film transistor structures on a common substrate layer (i.e., common upper layer or a common lower layer) may also be used.

During operation of display 14 in device 10, control circuitry (e.g., one or more integrated circuits on a printed circuit) may be used to generate information to be displayed on display 14 (e.g., display data). The information to be displayed may be conveyed to a display driver integrated circuit such as circuit 62A or 62B using a signal path such as a signal path formed from conductive metal traces in a rigid or flexible printed circuit such as printed circuit 64 (as an example).

Backlight structures 42 may include a light guide plate such as light guide plate 78. Light guide plate 78 may be formed from a transparent material such as clear glass or plastic. During operation of backlight structures 42, a light source such as light source 72 may generate light 74. Light source 72 may be, for example, an array of light-emitting diodes.

Light 74 from light source 72 may be coupled into edge surface 76 of light guide plate 78 and may be distributed in dimensions X and Y throughout light guide plate 78 due to the principal of total internal reflection. Light guide plate 78 may include light-scattering features such as pits or bumps. The light-scattering features may be located on an upper surface and/or on an opposing lower surface of light guide plate 78. Light source 72 may be located at the left of light guide plate 78 as shown in FIG. 5 or may be located along the right edge of plate 78 and/or other edges of plate 78.

Light 74 that scatters upwards in direction Z from light guide plate 78 may serve as backlight 44 for display 14. Light 74 that scatters downwards may be reflected back in the upwards direction by reflector 80. Reflector 80 may be formed from a reflective material such as a layer of plastic covered with a dielectric minor thin-film coating.

To enhance backlight performance for backlight structures 42, backlight structures 42 may include optical films 70. Optical films 70 may include diffuser layers for helping to homogenize backlight 44 and thereby reduce hotspots, compensation films for enhancing off-axis viewing, and brightness enhancement films (also sometimes referred to as turning films) for collimating backlight 44. Optical films 70 may overlap the other structures in backlight unit 42 such as light guide plate 78 and reflector 80. For example, if light guide plate 78 has a rectangular footprint in the X-Y plane of FIG. 5, optical films 70 and reflector 80 may have a matching rectangular footprint. If desired, films such as compensation films may be incorporated into other layers of display 14 (e.g., polarizer layers).

Figure 6:
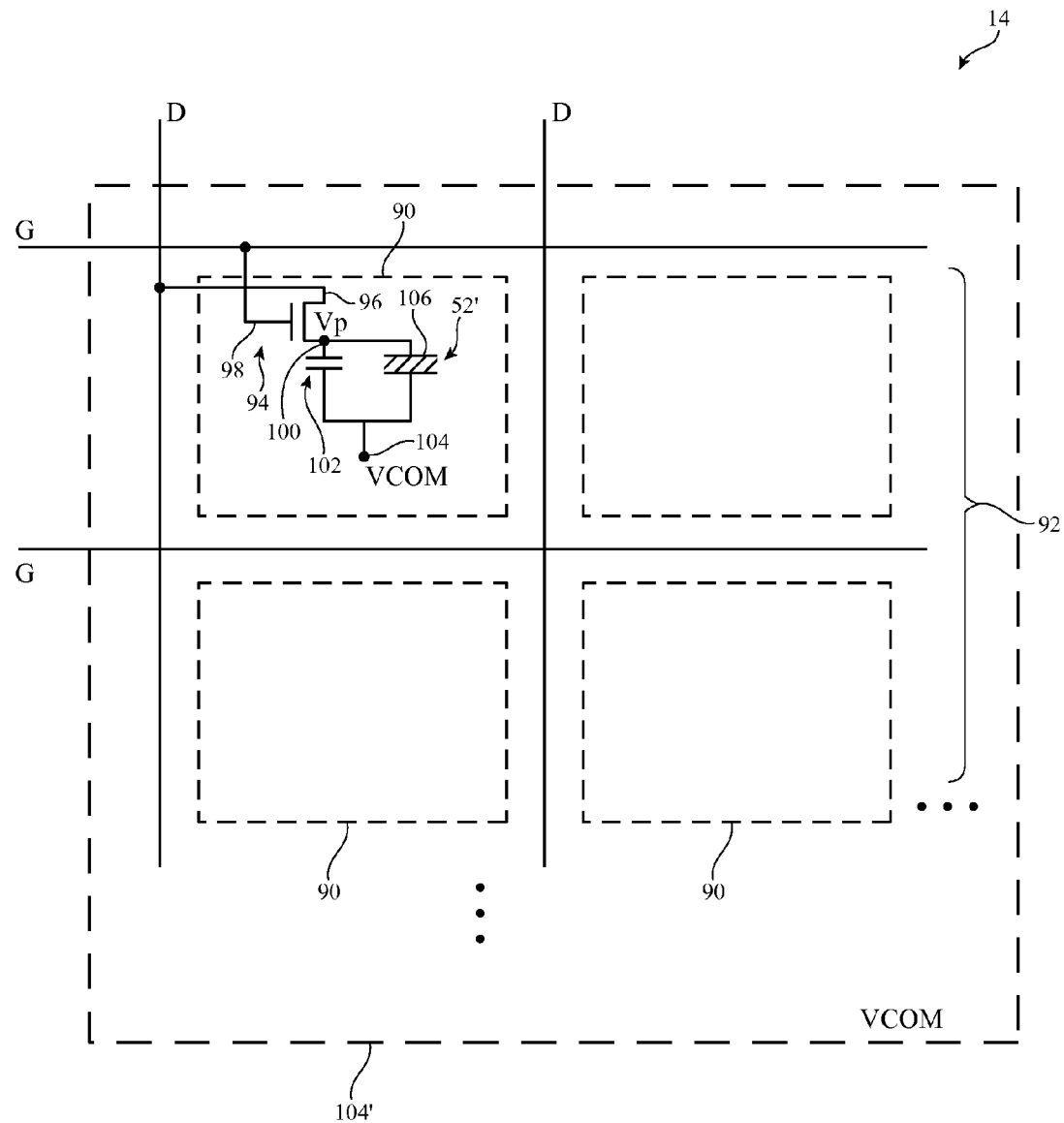
FIG. 6 is a top view of a portion of an array of pixels in a display in accordance with an embodiment.

As shown in FIG. 6, display 14 may include an array of pixels 90 such as pixel array 92. Pixel array 92 may be controlled using control signals produced by display driver circuitry. Display driver circuitry may be implemented using one or more integrated circuits (ICs) and/or thin-film transistors or other circuitry.

During operation of device 10, control circuitry in device 10 such as memory circuits, microprocessors, and other storage and processing circuitry may provide data to the display driver circuitry. The display driver circuitry may convert the data into signals for controlling pixels 90 of pixel array 92.

Pixel array 92 may contain rows and columns of pixels 90. The circuitry of pixel array 92 (i.e., the rows and columns of pixel circuits for pixels 90) may be controlled using signals such as data line signals on data lines D and gate line signals on gate lines G. Data lines D and gate lines G are orthogonal. For example, data lines D may extend vertically and gate lines G may extend horizontally (i.e., perpendicular to data lines D).

Pixels 90 in pixel array 92 may contain thin-film transistor circuitry (e.g., polysilicon transistor circuitry, amorphous silicon transistor circuitry, semiconducting oxide transistor circuitry such as indium gallium zinc oxide transistor circuitry, other silicon or semiconducting-oxide transistor circuitry, etc.) and associated structures for producing electric fields across liquid crystal layer 52 in display 14. Each display pixel may have one or more thin-film transistors. For example, each display pixel may have a respective thin-film transistor such as thin-film transistor 94 to control the application of electric fields to a respective pixel-sized portion 52' of liquid crystal layer 52.

The thin-film transistor structures that are used in forming pixels 90 may be located on a thin-film transistor substrate such as a layer of glass. The thin-film transistor substrate and the structures of display pixels 90 that are formed on the surface of the thin-film transistor substrate collectively form thin-film transistor layer 58 (FIG. 5).

Gate driver circuitry may be used to generate gate signals on gate lines G. The gate driver circuitry may be formed from thin-film transistors on the thin-film transistor layer or may be implemented in separate integrated circuits. The data line signals on data lines D in pixel array 92 carry analog image data (e.g., voltages with magnitudes representing pixel brightness levels). During the process of displaying images on display 14, a display driver integrated circuit or other circuitry may receive digital data from control circuitry and may produce corresponding analog data signals. The analog data signals may be demultiplexed and provided to data lines D.

The data line signals on data lines D are distributed to the columns of display pixels 90 in pixel array 92. Gate line signals on gate lines G are provided to the rows of pixels 90 in pixel array 92 by associated gate driver circuitry.

The circuitry of display 14 may be formed from conductive structures (e.g., metal lines and/or structures formed from transparent conductive materials such as indium tin oxide) and may include transistors such as transistor 94 of FIG. 6 that are fabricated on the thin-film transistor substrate layer of display 14. The thin-film transistors may be, for example, silicon thin-film transistors or semiconducting-oxide thin-film transistors.

As shown in FIG. 6, pixels such as pixel 90 may be located at the intersection of each gate line G and data line D in array 92. A data signal on each data line D may be supplied to terminal 96 from one of data lines D. Thin-film transistor 94 (e.g., a silicon transistor such as a thin-film polysilicon transistor or an amorphous silicon transistor, a semiconducting-oxide transistor such as an indium gallium zinc oxide transistor, or other suitable thin-film transistor) may have a gate terminal such as gate 98 that receives gate line control signals on gate line G. When a gate line control signal is asserted, transistor 94 will be turned on and the data signal at terminal 96 will be passed to node 100 as voltage Vp. Data for display 14 may be displayed in frames. Following assertion of the gate line signal in each row to pass data signals to the pixels of that row, the gate line signal may be deasserted. In a subsequent display frame, the gate line signal for each row may again be asserted to turn on transistor 94 and capture new values of Vp.

Pixel 90 may have a signal storage element such as capacitor 102 or other charge storage elements. Storage capacitor 102 may be used to help store signal Vp in pixel 90 between frames (i.e., in the period of time between the assertion of successive gate signals).

Display 14 may have a common electrode coupled to node 104. The common electrode (which is sometimes referred to as the common voltage electrode, Vcom electrode, or Vcom terminal) may be used to distribute a common electrode voltage such as common electrode voltage Vcom to nodes such as node 104 in each pixel 90 of array 92. As shown by illustrative electrode pattern 104' of FIG. 6, Vcom electrode 104 may be implemented using a blanket film of a transparent conductive material such as indium tin oxide, indium zinc oxide, other transparent conductive oxide material, and/or a layer of metal that is sufficiently thin to be transparent (e.g., electrode 104 may be formed from a layer of conductive oxide or other transparent conductive layer that covers all of pixels 90 in array 92).

In each pixel 90, capacitor 102 may be coupled between nodes 100 and 104. A parallel capacitance arises across nodes 100 and 104 due to electrode structures in pixel 90 that are used in controlling the electric field through the liquid crystal material of the pixel (liquid crystal material 52'). As shown in FIG. 6, electrode structures 106 (e.g., a display pixel electrode with multiple fingers or other display pixel electrode for applying electric fields to liquid crystal material 52') may be coupled to node 100 (or a multi-finger display pixel electrode may be formed at node 104). During operation, electrode structures 106 may be used to apply a controlled electric field (i.e., a field having a magnitude proportional to Vp-Vcom) across pixel-sized liquid crystal material 52' in pixel 90. Due to the presence of storage capacitor 102 and the parallel capacitances formed by the pixel structures of pixel 90, the value of Vp (and therefore the associated electric field across liquid crystal material 52') may be maintained across nodes 106 and 104 for the duration of the frame.

The electric field that is produced across liquid crystal material 52' causes a change in the orientations of the liquid crystals in liquid crystal material 52'. This changes the polarization of light passing through liquid crystal material 52'. The change in polarization may, in conjunction with polarizers 60 and 54 of FIG. 5, be used in controlling the amount of light 44 that is transmitted through each pixel 90 in array 92 of display 14.

Figure 7:
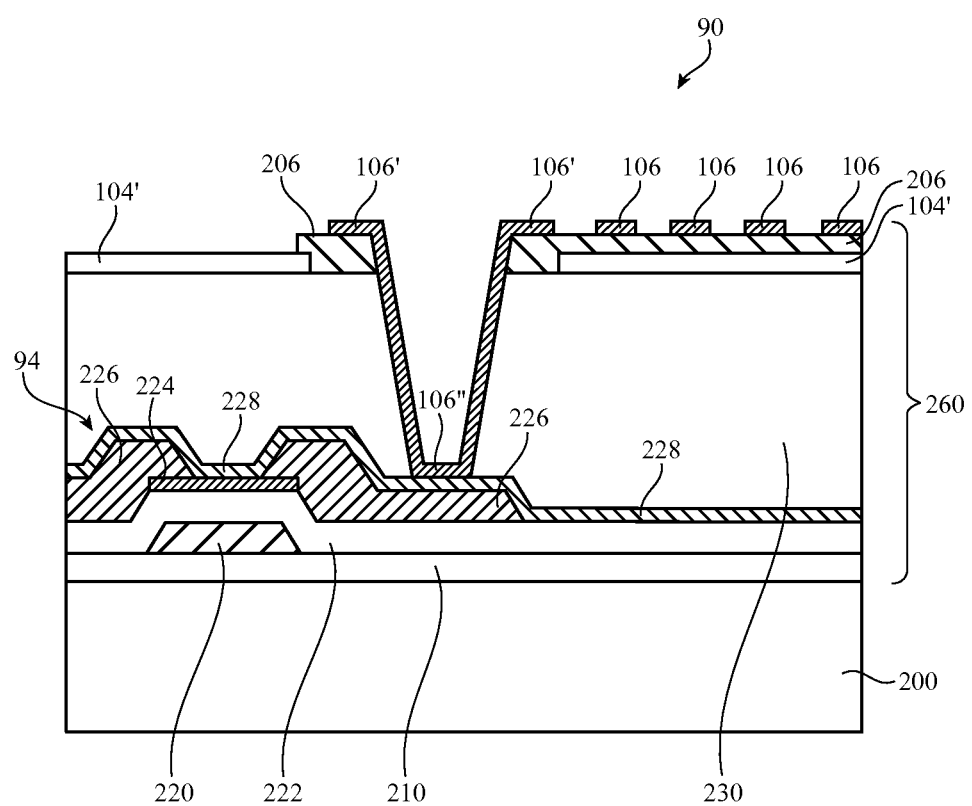
FIG. 7 is a cross-sectional side view of a portion of an illustrative display in accordance with an embodiment.

FIG. 7 is a cross-sectional side view of a portion of an illustrative display layer in display 14 that has thin-film transistor circuitry and pixel electrodes for applying electric fields to liquid crystal layer 52. The display structures of FIG. 7 may be used in forming the upper layer in display 14 (i.e., layer 56 of FIG. 5) or may be used in forming the lower layer in display 14 (i.e., layer 58 of FIG. 5).

The display structures of FIG. 7 may include substrate 200. Substrate 200 may be formed from glass, ceramic, plastic, or other substrate material. Thin-film transistor structures 260 may be formed on substrate 200. Thin-film transistor structures 260 may be formed from unpatterned blanket layers of material and patterned layers of material. The layers of structures 260 may include dielectric layers, transparent conductive layers such as conducting oxide layers, and metal layers (as examples).

As shown in FIG. 7, thin-film transistor structures 260 may include dielectric base layer 210. Base layer 210 may be formed from dielectric and may include one or more layers of material (e.g., one or more dielectric buffer layers, dielectric planarization, etc.). The dielectric that forms base layer 210 may include inorganic dielectrics such as silicon oxide, silicon nitride, silicon oxynitride, other inorganic materials, organic dielectric, etc.

A layer of metal may be formed on base layer 210. For example, a first metal layer may be patterned to form structures such as transistor gate 220 for thin-film transistor 94.

Gate insulator layer 222 may be formed over layer 210 and metal layer 220 (i.e., gate 220 may be interposed between layer 210 and layer 222). Gate insulator layer 222 may be formed from one or more dielectric layers (e.g., layers formed from materials such as silicon nitride, silicon oxide, other inorganic dielectric materials, etc.).

Semiconductor layer 224 (e.g., a layer for forming the active region of transistor 94) may be formed on gate insulator 222. With this type of arrangement, which may sometimes be referred to as a bottom gate arrangement, the gate of transistor 94 (gate 220) is located closer to substrate 200 than semiconductor layer 224 is located relative to substrate 200. This is merely illustrative. Transistor 94 may use a top gate configuration, a dual gate configuration, or other suitable arrangement. Transistor 94 may have source-drain terminals formed from a second patterned metal layer such as patterned metal layer 226. Additional transistors (e.g., semiconducting oxide transistors and/or silicon transistors) may be incorporated among the layers of display 14, if desired.

Dielectric layer 228 may cover metal layer 226. Dielectric layer 228 may be formed from inorganic and/or organic materials. For example, dielectric layer 228 may be formed from one or more layers of inorganic dielectric such as silicon oxide, silicon nitride, silicon oxynitride, other inorganic dielectric materials, organic dielectric materials, etc. Dielectric layer 228 may be used for passivation and/or may serve as an interlayer dielectric layer (e.g., to isolate metal lines that are used to route signals in display 14). In situations in which dielectric layer 228 includes multiple sublayers, metal routing lines may be interposed between respective sublayers (e.g., there may be a third patterned metal layer interposed between first and second dielectric layers in layer 228). If desired, additional patterned metal layers may be incorporated into display 14 (e.g., by forming patterned metal between respective dielectric layers).

Pixel electrodes 106 may be formed from a layer of transparent conductive material (e.g., a conductive oxide) such as indium tin oxide (ITO) or indium zinc oxide (IZO).

Planarization layer 230 (e.g., a polymer layer such as an acrylic layer or other suitable dielectric layer) may be formed from one or more sublayers and may have an opening that allows portions 106' and 106" of the electrode layer to form a short circuit with one of source-drain electrodes 226 through an opening in planarization layer 228. The other portions of patterned electrode 106 may form a set of electrode fingers for pixel 90.

Common electrode layer 104' may be formed on the outer surface of planarization layer 230. Common electrode layer 104' may be formed from a transparent conductive material such as a transparent conductive oxide (e.g., indium tin oxide, indium zinc oxide, etc.). Dielectric layer 206 (e.g., a passivation layer) may separate common electrode layer 104' from electrodes 106. A coating such as a polymer coating may cover electrodes 106. Liquid crystal layer 52 may be formed adjacent to the polymer coating.

Thin-film structures of the type shown in FIG. 7 may be used in forming transistors such as transistor 94, capacitors such as storage capacitor 102, electrodes such as electrodes 106, and other circuitry for display 14. The structures of FIG. 7 may be used in forming upper display layer 56 or lower display layer 58 of display 14.

Not all of the dielectric layers of structures 260 have the same index of refraction. As a result, there is a potential for index of refraction differences between adjacent layers to lead to undesired optical effects. For example, index of refraction differences may lead to undesired reflections of ambient light (e.g., when structures 260 are located in an upper layer of display 14). Index of refraction differences may also create thin-film interference filters that can impart undesired color shifts to backlight 44 (e.g., when display 14 is being viewed by viewer 48 at a non-zero angle with respect to the surface normal of the display).

Figure 8:
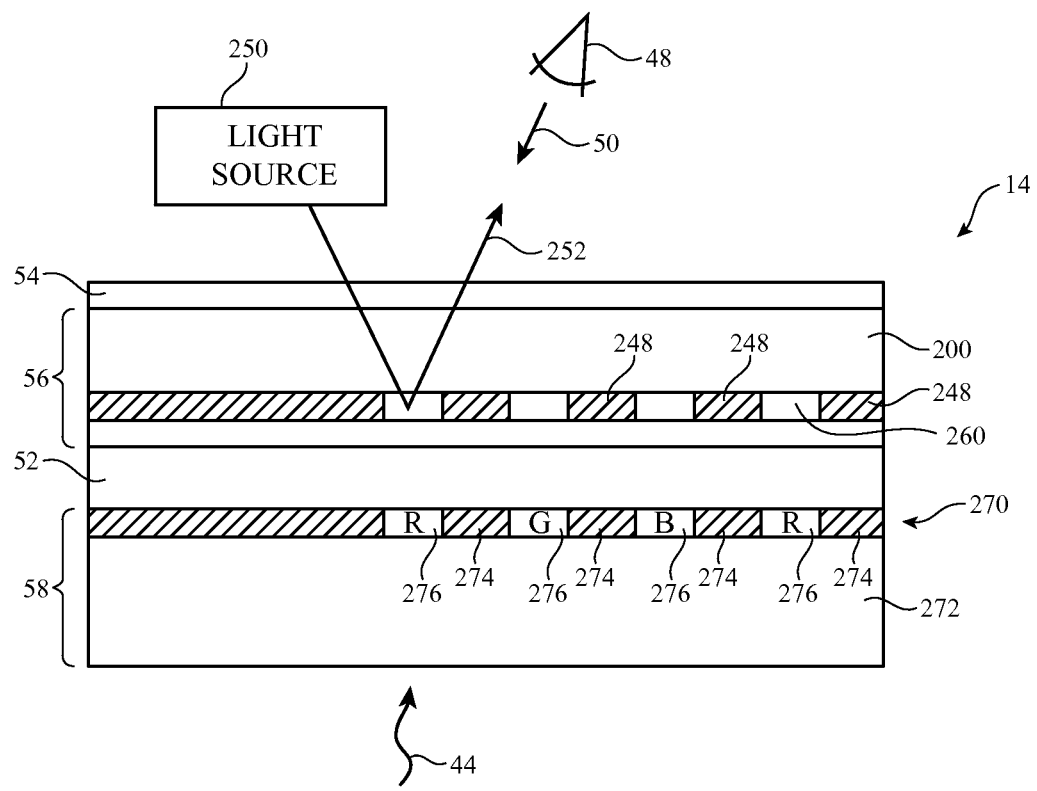
FIG. 8 is a cross-sectional side view of an illustrative display in accordance with an embodiment showing how there is a potential for light reflections from the display.

Consider, as an example, the illustrative display configuration of FIG. 8. In the example of FIG. 8, display 14 has an upper display layer (layer 56) that includes thin-film transistor structures 260—i.e., layer 56 is a thin-film transistor layer in the example of FIG. 8. Display 14 also has a lower display layer (layer 58) that serves a color filter layer in display 14 of FIG. 8. Layer 58 of FIG. 8 has substrate 272 (e.g., a glass layer, layer of ceramic, plastic layer, etc.) and color filter structures 270 (e.g., opaque layer 274 and an array of red R, green G, and blue B color filter elements 276 in an array of respective openings in opaque layer 274).

In the illustrative display of FIG. 8, structures 260 include patterned opaque masking layer 248. Layer 248 may be formed from patterned black polymer or other opaque material having a grid of pixel-sized openings. Each opening may allow colored backlight that has passed through a respective color filter element 276 to pass through display 14 for viewing by viewer 48. Reflections from the grid (which forms a diffraction grating) and from layers in structures 260 with different indices of refraction may allow a viewer such as viewer 48 who is viewing display 14 in direction 50 (e.g., at an off-axis angle) to view undesired ambient light reflections such as light reflection 252 from ambient light source 250. The propagation of backlight 44 may also be affected by the index of refraction values of the layers of display 14. This is because layers with different index of refraction values can potentially form an unintended thin-film interference filter that can impart undesired color shifts to off-axis light (e.g., backlight 44 that has passed through display 14). Color shifts have the potential to adversely affect display performance in configurations in which upper display layer 56 is a thin-film transistor layer with layers having different indices of refraction, in configurations in which lower display layer 58 is a thin-film transistor layer with layers having different indices of refraction, and in other display configurations.

To minimize undesired reflections and color shifts, one or more the dielectric layers of display 14 may be fabricated with continuously varying or stepped indices of refraction. These types of varying index of refraction profiles are sometimes referred to as graded index profiles. When a dielectric layer has a graded index, the dielectric layer may serve as an index matching layer that helps smooth out index of refraction discontinuities in the dielectric layers of display 14. A graded index layer may, for example, be sandwiched between first and second layers with respective first and second different index of refraction values. Portions of the graded index layer adjacent to the first layer may have an index of refraction that is equal to or nearly equal to the first index of refraction value. Portions of the graded index layer adjacent to the second layer may have an index of refraction that is equal or nearly equal to the second index of refraction value. There may be any suitable number of graded index layers in display 14 (e.g., one or more, two or more, three or more, four or more, etc.). When graded index values are used in display 14, reflections and color shifts that might otherwise arise due to index of refraction differences between the dielectric layers of the display may be minimized or eliminated.

Figure 9:
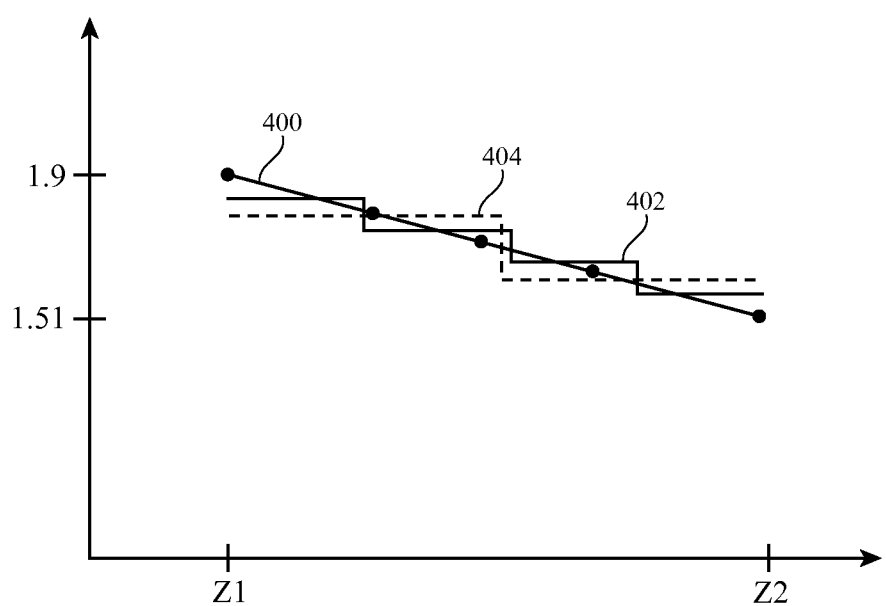
FIG. 9 is a graph showing how the index of refraction of graded index dielectric layer may be varied across the thickness of the layer in accordance with an embodiment.

A graph illustrating possible index of refraction profiles for a graded index dielectric layer is shown in FIG. 9. There are three different curves in the example of FIG. 9, each corresponding to a different illustrative index of refraction profile for a dielectric layer in display 14. At one edge of the graded index layer (i.e., at position Z1), the graded layer is adjacent to a material with a first index of refraction value (i.e., a dielectric layer with an index of refraction of 1.9 may be located at Z values less than Z1 in the example of FIG. 9). At the opposing edge of the dielectric layer (i.e., at position Z2), the graded index layer is adjacent to a material with a second index of refraction value (i.e., a dielectric layer with an index of refraction value of 1.51 may be located at Z values greater than Z2 in the example of FIG. 9).

The three different profiles of FIG. 9 each allow the graded index layer to minimize index of refraction differences between the graded index layer and the adjacent layers at Z1 and Z2. With the continuously varying index of refraction profile given by curve 400, the graded index layer has an index of 1.9 at Z1 (to match the index of refraction of 1.9 of the adjacent layer at Z1) and has an index of refraction of 1.51 at Z2 (to match the index of refraction of 1.51 of the adjacent layer at Z2). The index varies continuously between Z1 and Z2. To facilitate manufacturing, it may be desirable to provide the dielectric layer with a step-wise varying index of refraction profile such as two-step profile 404 or four step profile 402. In the FIG. 9 example, the two-step and four-step graded index layers have index values that closely match (but do not exactly match) the indices of refraction of the adjacent layers. If desired, the graded index layer may include portions with a continuously varying index and portions with step-wise varying indices. The graded index may also contain other numbers of index or refraction steps, continuously varying index profiles with different shapes, etc.

Graded index dielectric layers may be formed by varying the composition of a deposited dielectric material during fabrication. For example, a chemical vapor deposition process may be used to deposit a dielectric such as silicon oxynitride with a composition that ranges from a silicon oxide rich material (having an index of refraction close to 1.47, which is the index of refraction for silicon oxide) to a silicon nitride rich material (having an index of refraction close to 1.9, which is the index of refraction for silicon nitride). The silicon oxynitride dielectric may, for example, be deposited from a mixture of $N_2O:SiH_4/N_2$. The ratio of $N_2O$ to $SiH_4/N_2$ may be varied continuously or in a step-wise fashion to form a graded index silicon oxynitride layer. When the ratio of $N_2O$ to $SiH_4/N_2$ is high, the silicon oxynitride will be rich in silicon nitride. When the ratio of $N_2O$ to $SiH_4/N_2$ is low, the silicon oxynitride will be rich in silicon oxide. In configurations in which one or more graded index layers are used to smooth index discontinuities between silicon oxide layers and silicon nitride layers, a graded index silicon oxynitride layer will be able to match the index of refraction of both silicon oxide and silicon nitride. Silicon oxynitride graded index layers may also be used to smooth index discontinuities between dielectric layers formed from materials with other indices of refraction and/or other types of graded index layer may be used in display 14. The use of silicon oxynitride to form graded index layers in display 14 is merely illustrative.

Figure 10:
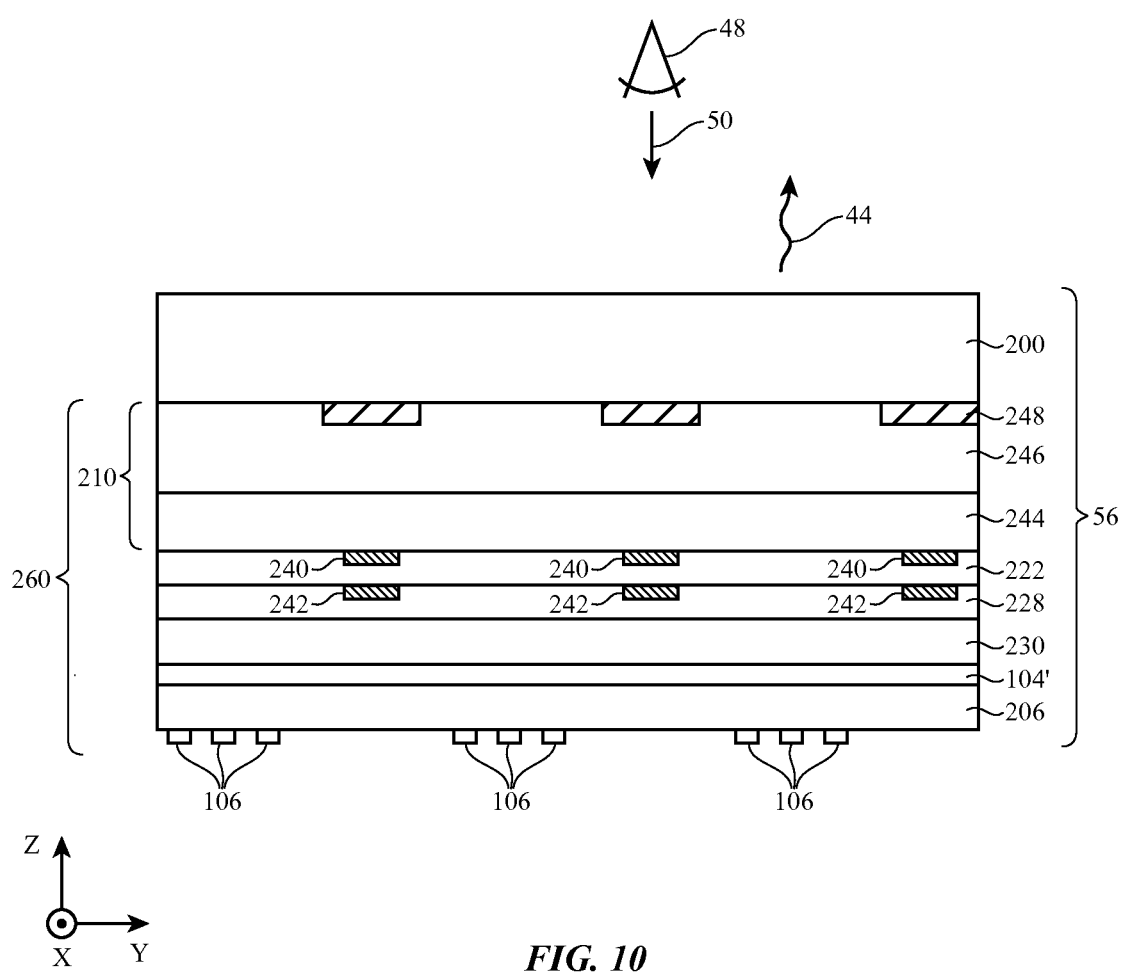
FIG. 10 is a cross-sectional side view of an upper display layer such as a thin-film transistor layer in a display of the type shown in FIG. 7 that has one or more layers with varying index of refraction values of the type shown in FIG. 9 in accordance with an embodiment.

FIG. 10 is a cross-sectional side view of upper display layer 56 of display 14 in an illustrative configuration in which upper layer 56 is a thin-film transistor layer that includes one or more graded index dielectric layers. In this type of configuration, lower layer 58 may be a color filter layer (see, e.g., display 14 of FIG. 8).

As shown in FIG. 10, layer 56 may include substrate layer 200. Substrate 200 may be formed from a transparent layer of material such as glass, ceramic, plastic, etc. Thin-film transistor structures 260 may be formed on the lower surface of substrate layer 200. Structures 260 may include dielectric base layer 210, dielectric gate insulator layer 222, dielectric layer 228, planarization layer 230, common electrode layer 104', passivation dielectric layer 206, and electrodes 106. Structures 240 and 242 lie under the opaque structures formed from layer 248 and may be formed between or within layers 210, 222, and 228. Structures 240 and 242 may be metal layers 220 and 226 of FIG. 7 and/or may include other semiconductor layers or metal layers for display 14.

Base layer 210 may include a planarization layer such as layer 246. Layer 246 may be used to cover and planarize patterned opaque masking layer 248. Layer 246 may be formed from a material such as spin-on glass that is stable during subsequent high temperature fabrication processes (e.g., processes involved in forming thin-film transistor structures 260 on layer 246). Spin-on glass is rich in silicon oxide and has a relatively low index of refraction (e.g., 1.51). Dielectric layer 244 may serve as a buffer layer (passivation layer) that helps protect spin-on glass layer 246 from metal etchant when structures such as structures 240 are being patterned. Gate insulator 222 may be formed from a relatively high index of refraction material such as silicon nitride or may contain a silicon nitride sublayer.

To help reduce the impact of the index of refraction difference between the silicon nitride of layer 222 and the silicon oxide of layer 246, dielectric passivation layer 244 may be provided with a graded index. For example, dielectric passivation layer 244 may be formed from a layer of silicon oxynitride with a continuously varying or step-wise varying index of refraction. Adjacent to layer 246, layer 244 may exhibit an index of refraction of 1.51 or close to 1.51. Adjacent to layer 222, layer 244 may exhibit an index of refraction of 1.9 or close to 1.9.

If desired, graded index layers may be incorporated into display 14 to reduce the impact of other index of refraction discontinuities. For example, if layers 222 and 228 each include a silicon oxide layer and a silicon nitride layer, a graded index layer such as a silicon oxynitride graded index layer may be sandwiched between each of the silicon-oxide-to-silicon-nitride interfaces (or a subset of these graded index layers may be used). Planarization layer 230 may include one or more layers of a polymer such as acrylic with an index of refraction of about 1.5 (e.g., 1.52). In this type of configuration, a graded index layer may, if desired, be interposed between a silicon nitride layer in layer 228 and planarization layer 230 to help smooth out the index of refraction discontinuity between the nitride layer and layer 230. If desired, graded index layers may be incorporated elsewhere in the layers of layer 56 (e.g., between layer 230 and layer 104', between layer 104' and layer 206, etc.). The example of FIG. 10 is merely illustrative.

Figure 11:
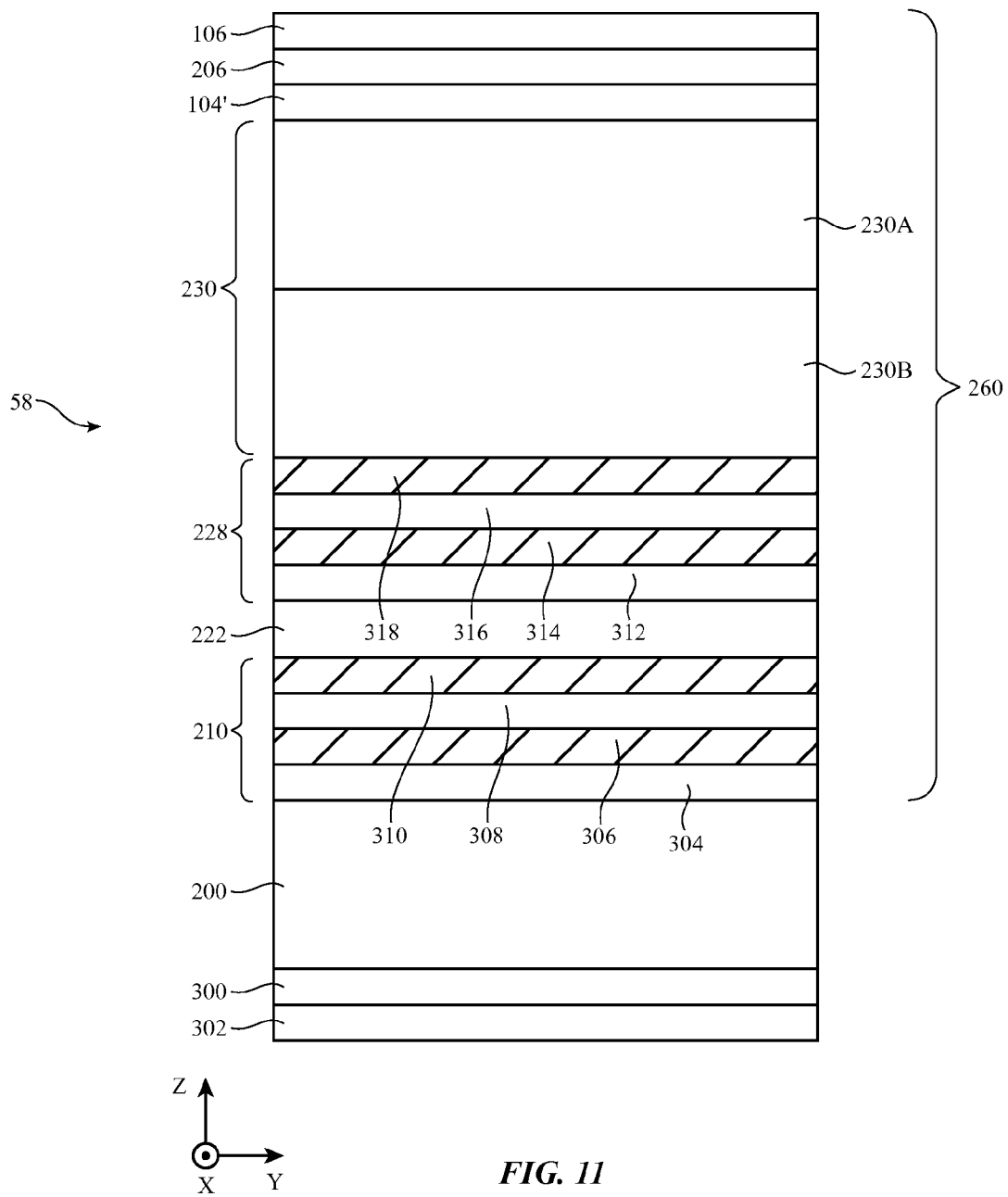
FIG. 11 is a cross-sectional side view of a lower display layer such as a thin-film transistor layer in a display that has one or more layers with varying index of refraction values of the type shown in FIG. 9 in accordance with an embodiment.

FIG. 11 is a cross-sectional side view of lower display layer 58 of display 14 in an illustrative configuration in which lower layer 58 is a thin-film transistor layer that includes one or more graded index dielectric layers. In this type of configuration, upper layer 56 may be a color filter layer.

As shown in FIG. 11, layer 58 may include substrate layer 200. Substrate 200 may be formed from a transparent layer of material such as glass, ceramic, plastic, etc. Thin-film transistor structures 260 may be formed on the upper surface of substrate layer 200. Transparent conductive layer 302 (e.g., an indium tin oxide layer, indium zinc oxide layer, or other transparent conductive oxide layer that serves as an electrostatic discharge layer) may be formed on the bottom of substrate 200. Layer 302 may have an index of about 2.0 and substrate 200 may be a glass layer having an index of about 1.52. If desired, index mating layer 300 may be interposed between layers 200 and 302 to reduce the impact of the index of refraction discontinuity between layers 200 and 302. Layer 300 may have a graded index of refraction (continuously varied or step-wise varied) or may be a dielectric layer with an index value that lies between the index values of layers 200 and 302.

Base layer 210 may include layers 304, 306, 308, and 310. Layers 306 and 310 may be buffer layers (e.g., inorganic buffer layers). Layers 306 and 310 may have different indices of refraction. For example, layer 306 may be a silicon nitride layer having an index of refraction of about 2.0 (or 1.9) and layer 310 may be a silicon oxide layer having an index of refraction of about 1.48. To reduce the impact of index of refraction discontinuities, graded index layers may be incorporated into display 14 in the vicinity of layers 306 and 310. For example, graded index layer 304 may be interposed between layer 200 and layer 306. Layer 304 may have a continuously varying index or a step-wise varying index. For example, layer 304 may have a first sublayer with an index of 1.66 adjacent to layer 200 and a second sublayer with an index of 1.83 adjacent to layer 306 or layer 304 may have three or more sublayers with step-wise varying index values Graded index layer 308 may be interposed between layer 306 and layer 310. Layer 308 may have a continuously varying index or a step-wise varying index. For example, layer 308 may have a first sublayer with an index of 1.83 adjacent to layer 306 and a second sublayer with an index of 1.66 adjacent to layer 310 or layer 308 may have three or more sublayers with step-wise varying index values.

Dielectric layer 228 (e.g., interlayer dielectric) may include first interlayer dielectric layer 314 and second interlayer dielectric layer 318. Layers 314 and 318 may have different indices of refraction. For example, layer 314 may be a silicon nitride layer having an index of refraction of about 2.0 (or 1.9) and layer 318 may be a silicon oxide layer having an index of refraction of about 1.48. To reduce the impact of index of refraction discontinuities, graded index layers may be incorporated into display 14 in the vicinity of layers 314 and 318. For example, graded index layer 312 may be interposed between gate insulator layer 222 (e.g., a layer of silicon oxide of index 1.48) and layer 314. Layer 312 may have a continuously varying index or a step-wise varying index. For example, layer 312 may have a first sublayer with an index of 1.66 adjacent to layer 222 and a second sublayer with an index of 1.83 adjacent to layer 314 or layer 312 may have three or more sublayers with step-wise varying index values.

Graded index layer 316 may be interposed between layer 318 and layer 314. Layer 316 may have a continuously varying index or a step-wise varying index. For example, layer 316 may have a first sublayer with an index of 1.83 adjacent to layer 314 and a second sublayer with an index of 1.66 adjacent to layer 318 or layer 308 may have three or more sublayers with step-wise varying index values.

The index values of layers such as layers 318 (index 1.48) and polymer sublayers 230A and 230B of planarization layer 230 (index 1.52) are well matched, so fabrication may be simplified by omitting graded index material between layers 318 and 230 and between other adjacent layers in display 14 with similar index values. In general, however, one or more graded index layers may be incorporated into display 14 whenever there are index of refraction discontinuities (e.g., index steps between layers of 0.1 or more, 0.2 or more, 0.3 or more, 0.4 or more, or 0.5 or more).

The foregoing is merely illustrative and various modifications can be made by those skilled in the art without departing from the scope and spirit of the described embodiments. The foregoing embodiments may be implemented individually or in any combination.

What is claimed is:

1. A liquid crystal display having an array of pixels;
an upper polarizer;
a lower polarizer
a layer of liquid crystal material;
a color filter layer between the lower polarizer and the layer of liquid crystal material; and
a thin-film transistor layer between the layer of liquid crystal material and the upper polarizer, wherein the thin-film transistor layer comprises:
a substrate layer;
a patterned layer of opaque masking material with openings for the pixels;
a first dielectric layer that covers the patterned layer of opaque masking material;
a second dielectric layer; and a third dielectric layer interposed between the first and second dielectric layers, wherein the first dielectric layer has a first index of refraction, wherein the second dielectric layer has a second index of refraction that is different than the first index of refraction, and wherein the third dielectric layer has a graded index of refraction to minimize reflections arising from a difference between the first and second indices of refraction.

2. The liquid crystal display defined in claim 1 wherein the first dielectric layer comprises spin-on glass that planarizes the patterned layer of opaque masking material.

3. The liquid crystal display defined in claim 2 wherein the second dielectric layer comprises a thin-film transistor gate insulator layer.

4. The liquid crystal display defined in claim 3 wherein the spin-on glass layer includes silicon dioxide.

5. The liquid crystal display defined in claim 4 wherein the second dielectric layer includes silicon nitride.

6. The liquid crystal display defined in claim 5 wherein the third dielectric layer comprises silicon oxynitride.

7. The liquid crystal display defined in claim 6 wherein the third dielectric layer comprises a plurality of sublayers with different respective index of refraction values so that the third dielectric layer has a step-wise varying index of refraction profile.

8. The liquid crystal display defined in claim 7 wherein the third dielectric layer has only two of the sublayers.

9. The liquid crystal display defined in claim 7 wherein the third dielectric layer has at least three of the sublayers.

10. The liquid crystal display defined in claim 6 wherein the third dielectric layer comprises a silicon oxynitride layer having a continuously varying index of refraction value.

11. The liquid crystal display defined in claim 10 further comprising backlight structures that supply backlight that passes through the lower polarizer before passing through the liquid crystal layer.

12. A liquid crystal display having an array of pixels;
an upper polarizer;
a lower polarizer;
a layer of liquid crystal material;
a color filter layer between the upper polarizer and the layer of liquid crystal material; and
a thin-film transistor layer between the layer of liquid crystal material and the lower polarizer, wherein the thin-film transistor layer comprises:
a substrate layer;
a first dielectric layer having a first index of refraction; and
a second dielectric layer having a second index of refraction; and
a graded index of refraction dielectric layer that is interposed between the first and second dielectric layers.

13. The liquid crystal display defined in claim 12 wherein the first dielectric layer comprises a silicon dioxide interlayer dielectric layer, wherein the second dielectric layer comprises a silicon nitride interlayer dielectric layer, and wherein the graded index of refraction dielectric layer comprises a silicon oxynitride layer with a continuously varying index of refraction.

14. The liquid crystal display defined in claim 12 wherein the first dielectric layer comprises a silicon dioxide interlayer dielectric layer, wherein the second dielectric layer comprises a silicon nitride interlayer dielectric layer, and wherein the graded index of refraction dielectric layer comprises a silicon oxynitride layer with a step-wise varying index of refraction produced by multiple sublayers having different indices of refraction.

15. The liquid crystal display defined in claim 12 wherein the first dielectric layer comprises a silicon nitride interlayer dielectric layer, wherein the second dielectric layer comprises a silicon oxide thin-film transistor gate insulator layer, and wherein the graded index of refraction dielectric layer comprises a silicon oxynitride layer with a continuously varying index of refraction.

16. The liquid crystal display defined in claim 12 wherein the first dielectric layer comprises a silicon nitride interlayer dielectric layer, wherein the second dielectric layer comprises a silicon oxide thin-film transistor gate insulator layer, and wherein the graded index of refraction dielectric layer comprises a silicon oxynitride layer with a step-wise varying index of refraction produced by multiple sublayers having different indices of refraction.

17. The liquid crystal display defined in claim 12 wherein the first dielectric layer comprises a silicon oxide buffer layer formed adjacent to a silicon oxide gate insulator layer, wherein the second dielectric layer comprises a silicon nitride buffer layer, and wherein the graded index of refraction dielectric layer comprises a silicon oxynitride layer with a continuously varying index of refraction.

18. The liquid crystal display defined in claim 12 wherein the first dielectric layer comprises a silicon oxide buffer dielectric layer formed adjacent to a silicon oxide gate insulator layer, wherein the second dielectric layer comprises a silicon nitride buffer dielectric layer, and wherein the graded index of refraction dielectric layer comprises a silicon oxynitride layer with a step-wise varying index of refraction produced by multiple sublayers having different indices of refraction.

19. A liquid crystal display having an array of pixels;
an upper polarizer;
a lower polarizer;
a layer of liquid crystal material;
a color filter layer between the upper polarizer and the layer of liquid crystal material; and
a thin-film transistor layer between the layer of liquid crystal material and the lower polarizer, wherein the thin-film transistor layer comprises:
a substrate layer having a first index of refraction;
a dielectric buffer layer having a second index of refraction that is different than the first index of refraction; and
a graded index dielectric of refraction layer that is interposed between the substrate and the dielectric buffer layers.

20. The liquid crystal display defined in claim 19 wherein the dielectric buffer layer comprises a silicon nitride layer and wherein the graded index of refraction dielectric layer comprises a silicon oxynitride layer with a continuously varying index of refraction.

21. The liquid crystal display defined in claim 19 wherein the dielectric buffer layer comprises a silicon nitride layer and wherein the graded index of refraction dielectric layer comprises a silicon oxynitride layer with a step-wise varying index of refraction produced by multiple sublayers having different indices of refraction.

22. The liquid crystal display defined in claim 19 further comprising:
a conductive oxide layer; and
an index matching layer between the conductive oxide layer and the substrate layer, wherein the conductive oxide layer has a third index of refraction and wherein the index matching layer has an index of refraction that is between the first and second indices of refraction.

* * * * *